(12) United States Patent
Kakitani

(10) Patent No.: US 6,504,406 B1
(45) Date of Patent: Jan. 7, 2003

(54) TRACK AND HOLD CIRCUIT

(75) Inventor: Hisao Kakitani, Tokyo (JP)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/698,445

(22) Filed: Oct. 27, 2000

(30) Foreign Application Priority Data

Oct. 27, 1999 (JP) .......................................... 11-305425

(51) Int. Cl.[7] .............................................. G11C 27/02
(52) U.S. Cl. ............................ 327/94; 327/537; 327/96
(58) Field of Search .......................... 327/91, 94, 93, 327/96, 337, 534, 535, 537, 553–554, 95; 341/122

(56) References Cited

U.S. PATENT DOCUMENTS

| | | | | |
|---|---|---|---|---|
| 3,701,059 A | * | 10/1972 | Nyswander | 327/553 |
| 3,820,033 A | * | 6/1974 | Iwata | 327/94 |
| 5,324,995 A | * | 6/1994 | Yee | 327/91 |
| 5,517,140 A | * | 5/1996 | Hatsuda | 327/91 |
| 6,265,911 B1 | * | 7/2001 | Nairn | 327/94 |

FOREIGN PATENT DOCUMENTS

| | | |
|---|---|---|
| EP | 0875904 A2 | 11/1998 |
| JP | 54-107246 * | 8/1979 |
| JP | 3-219724 | 9/1991 |
| JP | 10-312698 | 11/1998 |

OTHER PUBLICATIONS

*A 1.6V 10-Bit 20 MHz Current-Mode Sample and Hold Circuit* By Yasuhiro Sugimoto, Dept. of Electrical and Electronics Engineering, Chuo University, listed in IEEE, 1995, pp. 1332–1335.

* cited by examiner

*Primary Examiner*—Terry D. Cunningham
*Assistant Examiner*—Long Nguyen

(57) ABSTRACT

In order to reduce harmonic distortion, a track and hold circuit comprising a MOS transistor switch, a hold capacitor, and a voltage stabilizer for biasing bulk potential of the MOS transistor switch at a certain voltage is disclosed.

4 Claims, 4 Drawing Sheets

TRACK AND HOLD CIRCUIT

BACKGROUND OF THE INVENTION

1. Field of the Invention

The present invention relates to a track and hold circuit and, more particularly, to a track and hold circuit with high precision and low distortion suitable for a front end of an analog-to-digital converter.

2. Description of the Related Art

A track and hold circuit is one of basic analog circuits used as, for example, a front end of an analog-to-digital converter and is used to sample the values of signals, continuously changing with time, at discrete time intervals. There are three factors in distortion of this track and hold circuit. These factors will be classified below using the most basic conventional example of a track and hold circuit shown in FIG. 4.

(A) Variation in the Charging Time of a Hold Capacitor in the Track Mode

A track and hold circuit shown in FIG. 4 consists of two amplifiers 101 and 102, a MOS transistor 103 operating as an FET switch, a hold capacitor 104, and a clock source 105. A bulk terminal of the MOS transistor 103 is connected to a common potential point (ground). Base resistance Ron with the MOS transistor 103 in the ON state depends on the gate driving voltage $V\Phi$, drain input voltage $V_{in}$, and threshold voltage $V_{th}$ of the MOS transistor 103 and the following relationship exists between them:

$$R_{on}=1/\{\beta(V_\Phi-V_{in}-V_{th})\} \quad (1)$$

Where $\beta$ is a constant depending on production process and $\beta=\mu C_{ox}W/L$ ($\mu$: mobility, $C_{ox}$: gate oxide capacitance per unit area, W: gate width, L: gate length).

Therefore, when $V_{in}$ varies, $R_{on}$ also varies. This leads to variations in a time constant for charging the hold capacitor 104 given by $R_{on} \times C_H$. The dependence of the on-state resistance $R_{on}$ of the MOS transistor 103 on signals, that is to say, the dependence of the on-state resistance $R_{on}$ of the MOS transistor 103 on $V_{in}$ which varies as a matter of course necessarily causes variations in the charging time of the hold capacitor and thus results in harmonic distortions.

(B) Electric Charge Injection at the Time of Mode Transition

As shown in FIG. 5, moreover, electric charges stored at the gate of the MOS transistor 103 are released at the time of the transition from the track mode to the hold mode. That is to say, electric charge Q1 injected into the gate of the MOS transistor 103 when the MOS transistor 103 is in the ON state is released when it becomes the OFF state. Furthermore, electric charge Q2 stored by parasitic capacity $C_{gs}$ between the gate and the source of the MOS transistor 103 is also released when it becomes the OFF state. The flow of electric charge Q1 and Q2 into the hold capacitor at the time of the MOS transistor 103 becoming the OFF state could cause harmonic distortions. It is known that Q1 and Q2 can be calculated by the following formulas:

$$Q1=-C_{ox}A(V_\Phi-V_{in}-V_{th}) \quad (2)$$

where $C_{ox}$ is the gate oxide capacitance per unit area of the MOS transistor 103, as stated above; A is the gate area of the MOS transistor 103; $V_\Phi$ is the clock voltage; $V_{in}$ is the drain input voltage, as stated above; and gate voltage $V_{th}$ is the threshold voltage of the MOS transistor 103, as stated above.

$$Q2=-C_{gs}(V_{in}+V_{th}) \quad (3)$$

where $C_{gs}$ is the capacitance between the gate and the source of the MOS transistor and $V_{th}$ is the threshold voltage, as stated above. Furthermore, $C_{gs}$ has dependence on the input voltage given by the following formula:

$$C_{gs}=C_{gs0}/\{1-(V_\Phi-V_{in}-V_{th})/\psi_0\}^{1/2} \quad (4)$$

where $\psi_0$ is what is called built-in potential and $C_{gs0}$ represents the value of $C_{gs}$ with $V_{gs}=0$.

Therefore, Q1 and Q2 both depend on the input signal voltage $V_{in}$, which could cause harmonic distortions. Q2 particularly depends on $V_{in}$ non-linearly.

Trials for reducing distortions caused by variations in input voltage have been made. One of them is to reduce the dependence of the on-state resistance on input signals by applying a gate higher driving voltage or by adopting the structure of a CMOS switch. With the former method, a high driving voltage will lead to an increase in electric charges being released at the transition. Furthermore, the use of high driving voltages is contrary to a tendency toward the use of lower voltages in recent circuit designs. The latter method requires a high-speed PMOS and has the problem of a shift in transition timing due to a difference in $V_{th}$.

Another attempt for changing gate voltages according to the level of input signals has been made. For example, see an application note AN301 of Siliconix Department of TEMIC Semiconductor Inc. (dated Mar. 10, 1997) or Japanese Patent No. 2833070 (Japanese Pat. Laid-open No. Heisei 3-219724). However, such circuit structure requires a voltage source of 10–15 volts. It therefore can be used for, for example, measurement instruments, but it is not suitable for system LSIs in which operating voltage has to be low. Moreover, driver circuits become complex.

The reduction of electric charge injection by a dummy switch has also been considered (see Japanese Pat. Laid-open No. Heisei 10-312698, for example). With this method, another MOS transistor is located between the above MOS transistor 103 and the amplifier 102 on the output side or the ground in order to absorb at least part of electric charges flowing into the hold capacitor. But this requires fine control of the drive timing of the additional MOS transistor. In addition, the more essential problem is that it is difficult to treat electric charge injection quantitatively.

SUMMARY OF THE INVENTION

Considering problems with the above related art, an object of the present invention is to provide a track and hold circuit which operates at a lower voltage and can reduce distortions in hold waveforms.

The present invention reduces distortions of a track and hold circuit by biasing the bulk or substrate potential of a MOS transistor switch with a certain voltage.

The present invention provides a track and hold circuit comprising a MOS transistor switch and a hold capacitor in which a certain voltage is applied to the bulk potential of the MOS transistor switch. Furthermore, the track and hold circuit may comprise an amplifier. A terminal of the hold capacitor which is connected to the MOS transistor switch is connected to the input of the amplifier, and the output from the amplifier forms that of the track and hold circuit. In addition, a buffer amplifier may be connected between the MOS transistor switch and the input end of the track and hold circuit.

The present invention also provides a track and hold circuit comprising an amplifier whose inverted input terminal receives input signals in the track mode, a hold capacitor one end of which connects electrically with the output of the amplifier and the other end of which becomes electrically connected to the inverted input terminal of the amplifier in the hold mode, a first MOS transistor switch connected between the other end of the hold capacitor and the inverted input terminal, a second MOS transistor switch located between the other end of the hold capacitor and a common potential point, a third MOS transistor switch connected between an input signal terminal and the inverted input terminal, a fourth MOS transistor switch connected between the input signal terminal and the common potential point, and a constant voltage circuit connected to bulk terminals of the first to fourth MOS transistor switches.

In these track and hold circuits according to the present invention, a constant voltage circuit may consist of a memory and a digital-to-analog converter which receives a digital signal from the memory.

DETAILED DESCRIPTION OF THE PREFERRED EMBODIMENTS

Figure 1:
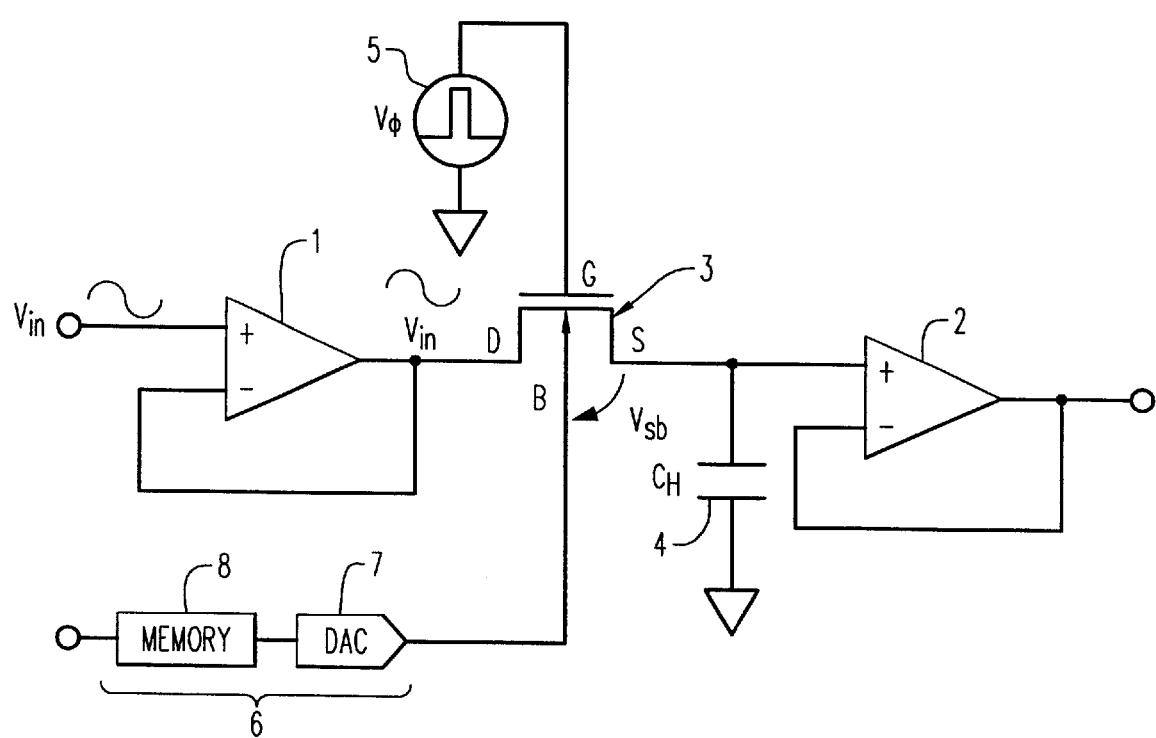
FIG. 1 is a circuit diagram showing a track and hold circuit according to a first embodiment of the present invention.

A first embodiment of the present invention is shown in FIG. 1. A track and hold circuit of the first embodiment comprises a buffer amplifier 1, an output-stage amplifier 2, a MOS transistor 3 (only one in this case) located between these two amplifiers and functioning as an FET switch, a clock source 5 connected to the gate of the MOS transistor 3, and a constant voltage circuit 6 connected to a bulk terminal (substrate terminal) of the MOS transistor 3. The constant voltage circuit 6 is basically a simple power-supply circuit which can adjust its output voltage at a constant value. In this embodiment, however, it comprises a digital-to-analog converter (DAC) 7 operating by a power source not shown and a memory 8 being capable of outputting a certain digital value thereto. To put it concretely, any memory device, such as a ROM or an EPROM, can be used as the memory 8, but a non-volatile memory is preferable.

Figure 2:
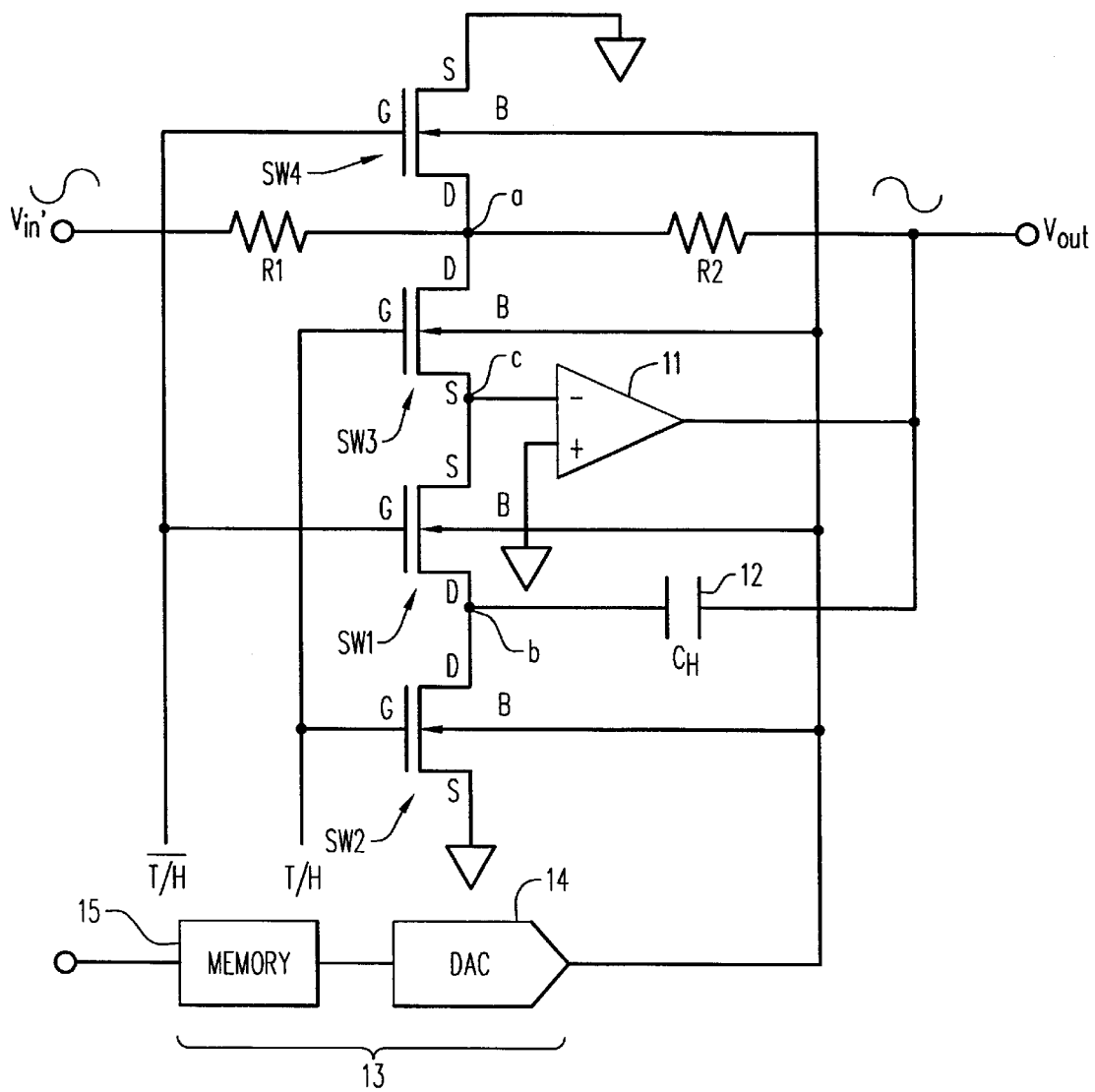
FIG. 2 is a circuit diagram showing a track and hold circuit according to a second embodiment of the present invention.

Next, a second embodiment of the present invention will be described below. The structure of a circuit of the second embodiment is shown in FIG. 2 as an example. In this embodiment the principle of the present invention is applied to an integral track and hold circuit. Main elements of this circuit structure are four MOS transistors SW1, SW2, SW3, and SW4 functioning as FET switches, an amplifier 11, and a hold capacitor 12 ($C_H$). Furthermore, a constant voltage circuit 13 specific to the present invention is added for biasing bulk potential (substrate potential) of each MOS transistor. Any circuit that can supply a certain adjustable voltage may be used as the constant voltage circuit 13, as with the above constant voltage circuit 6. In this case, the constant voltage circuit 13 comprises a digital-to-analog converter 14 and a memory 15 which can accept numerical values and output them as required. As in the above case, a ROM, an EPROM, or the like may be preferably used as the memory 15. The advantage of a combination of the digital-to-analog converter 14 and the memory 15 is that an operation for setting the bulk potential to a certain value in the track and hold circuit according to the present invention can be performed by inputting numerical values to the memory 15 with a computer or the like. This makes such operations as the setting of resistance values unnecessary. Moreover, the constant voltage circuit and the track and hold circuit can be fabricated on a single chip without the necessity of providing resistors or the like separately.

The circuit structure shown in FIG. 2 will be described below in further detail. The first and second MOS transistors, SW1 and SW2, are connected in series between inverted input terminal c of the amplifier 11 and a common potential point (ground), and the hold capacitor 12 (capacitor $C_H$) is connected between the output terminal of the amplifier 11 and the MOS transistors SW1 and SW2. The drains of SW1 and SW2 are connected with each other at node b, and the source of SW1 is connected to inverted input terminal c of the amplifier 11. The source of SW2 is connected to the common potential point.

The third and fourth MOS transistors, SW3 and SW4, are connected in series between inverted input terminal c of the amplifier 11 and the common potential point. The drains of SW3 and SW4 are connected with each other at node a, and the source of SW3 is connected to inverted input terminal c of the amplifier 11. The source of SW4 is connected to the common potential point. The gates of SW2 and SW3 are driven by a track and hold clock (T/H); the gates of SW1 and SW4 are driven by its inverted clock (shown in the drawings as T/H with a top line). These clocks are generated by external circuits.

In the track mode, the MOS transistors SW2 and SW3 are in the ON state and the MOS transistors SW1 and SW4 are in the OFF state. $V_{in}'$ is output as an inverted signal with an absolute value according to the amplifier gain. In the hold mode, the MOS transistors SW1 and SW4 are in the ON state and the MOS transistors SW2 and SW3 are in the OFF state. The hold capacitor 12 holds the voltage value of an inverted output signal at the time of SW2 becoming turned off. The MOS transistor SW4 is in the ON state, so an input current generated by input voltage $V_{in}'$ will flow into the common potential point and is separated from the output of the amplifier. In FIG. 2, wave-shaped symbols at input signal terminal $V_{in}'$ and output terminal $V_{out}$ show that the phase of an input wave is opposite to that of an output wave.

Next, how the circuit according to the present invention can reduce distortions will be considered below with reference to two of the several causes described above as examples. However, such consideration is intended to help understand the present invention and the scope of the present invention is not limited by it.

As stated above, the on-state resistance $R_{on}$ of a MOS transistor is given by the following formula:

$$R_{on}=1/\{\beta(V_\Phi-V_{in}-V_{th})\} \tag{5}$$

Figure 5:
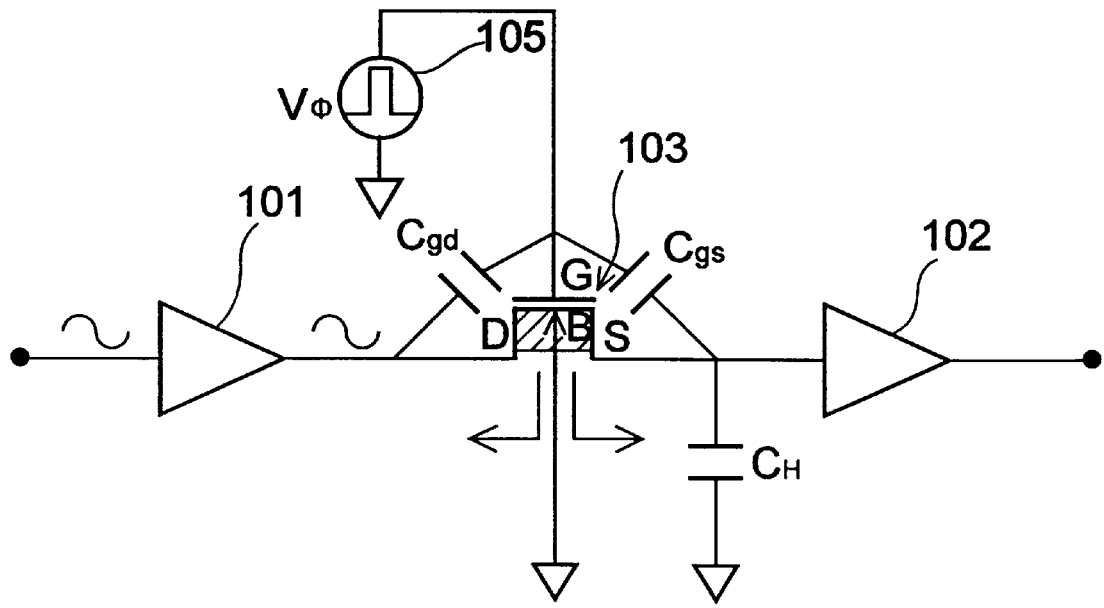
FIG. 5 is a circuit diagram for describing electric charge injection and parasitic capacity of a MOS transistor in the track and hold circuit according to the related art shown in FIG. 4.

Variations in the amount of electric charge injection at the time of the transition from the track mode to the hold mode shown in FIG. 5 is considered. The amount Q2 of overlap electric charge injection is given by the following formula:

$$Q2 = -C_{gs}(V_{in} + V_{th}) \quad (6)$$

where, as stated above, $C_{gs}$ has dependence on the input voltage given by the following formula:

$$C_{gs} = C_{gs0} / \{1 - (V_\Phi - V_{in} - V_{th})/\psi_0\}^{1/2} \quad (7)$$

Where $\psi_0$ is what is called built-in potential and $C_{gs0}$ represents the value of $C_{gs}$ with $V_{gs}=0$.

With respect to the input voltage dependence of $R_{on}$, $R_{on}$ becomes greater when $V_{in}$ becomes higher. Thus, in FIG. 2, supposing that the potential at node b is equal to the potential $V_{in}$, the potential at node b also rises. With respect to the overlap electric charge injection, when $V_{in}$ becomes higher, the absolute value of Q2 becomes greater while Q2 remains negative with Equations 6 and 7 being comprehensively considered. Q2 has the function of lowering the potential at node b. Each of these two causes of distortions therefore is canceled by the other. Distortions can be reduced by controlling the two causes.

The above formulas should be considered again. These formulas show that when the threshold voltage $V_{th}$ is changed, the slope of a change in Q2 and that of a change in $R_{on}$ change. The threshold voltage $V_{th}$ changes when the bias voltage at a bulk terminal of a MOS transistor is changed. The voltage $V_{bulk}$ at the bulk terminal therefore is changed in order to find the optimum point for the causes of distortion to be canceled. The present inventor has found that the optimum bias voltage at the bulk terminal considerably varies from product to product due to variables in production processes and among production lots.

Thus, the relationship between bias voltage at the bulk terminal and distortions in individual circuits or in circuit samples of each production lot is actually examined, and this bias voltage is adjusted to the optimum value based on the results. Such relationship between bias voltage and distortion can be measured automatically and bias voltage can be set to the optimum value by adjusting the output voltage from the constant voltage circuit. In this case, the combination of the memory 15 and the digital-to-analog converter 14 makes it possible to set the bias voltage by inputting a selected numerical value into the memory 15. In general, a value for the bias voltage applied to the bulk terminal of a MOS transistor must be set only once at the time of manufacture of a track and hold circuit and need not be readjusted later. However, it may be readjusted at an appropriate time using a writable EPROM or the like as the memory 15.

A circuit shown in FIG. 2 was actually made and its second and third harmonic distortions in the hold mode were measured. The measurement was performed with respect to the case in which the bulk potential is connected to the common potential point (example for comparison) and with respect to the case in which the bulk potential is biased at a certain voltage by the constant voltage circuit 13 shown in FIG. 2 (an example of the present invention). A sine wave with a voltage of ±5 V and a frequency of 100 kHz was used as an input. $C_H=100$ pF. The rate of sampling was 1 M per second (i.e., the sampling frequency=1 MHz).

Figure 3:
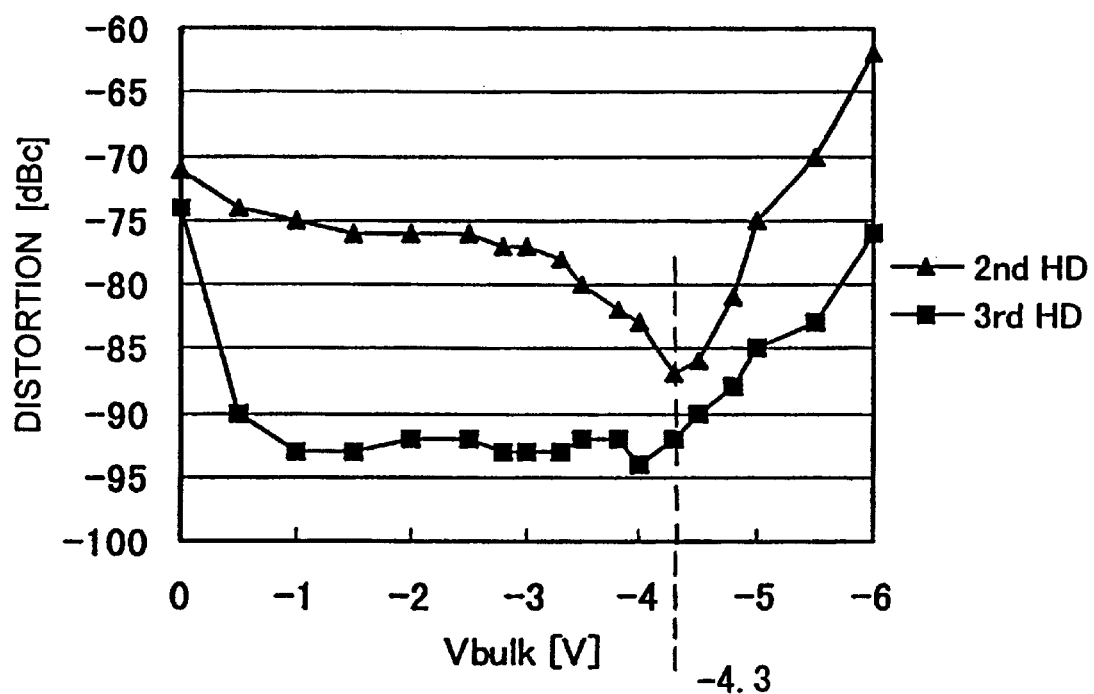
FIG. 3 is a graph showing the relationship between potential at a bulk terminal and second and third harmonic distortion in an example of the present invention.
Figure 4:
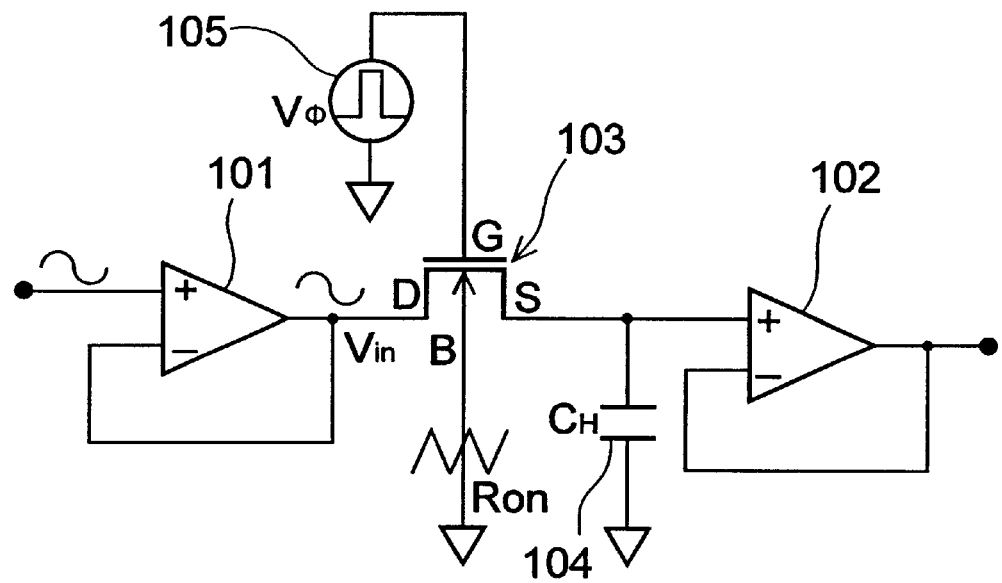
FIG. 4 is a circuit diagram showing a track and hold circuit according to the related art.

The relationship between $V_{bulk}$ and second harmonic distortion (2nd HD) and that between $V_{bulk}$ and third harmonic distortion (3rd HD) are shown in FIG. 3. This figure shows that when potential $V_{bulk}$ at the bulk terminal is changed, there exists points where distortion becomes minimum. In this example, a bias voltage of −4.3 V was used, and results shown in Table 1 below were obtained:

TABLE 1

|  | Second harmonic distortion | Third harmonic distortion |
| --- | --- | --- |
| Comparative example | −71 dBc | −74 dBc |
| The present invention | −87 dBc | −92 dBc |

The DC linearity, frequency range, noise floor, etc. of the example of the present invention were equal to those of the comparative example, which shows that harmonic distortions can be improved without undesirable side effects.

According to the present invention, harmonic distortion can be improved by using a level-shift circuit and DC linearity, frequency range, noise floor, etc. are not sacrificed, as stated above.

It should be understood that the foregoing description is only illustrative of the invention. The preferred embodiment examples of the present invention presented herein can be modified or revised by those skilled in the art without deviating from the invention. Consequently, the scope of the present invention is intended to encompass all such modifications and variances which fall within the appended claims. For example, an FET switch is not limited to a specific type of transistor, and the number of transistors can be changed depending on use or for further improvements.

The entire disclosure of Japanese Pat. Application No. 305425/1999 filed on Oct. 27, 1999 including the specification, claims, drawings and summary are incorporated herein by reference in its entirety.

What is claimed is:

1. A track and hold circuit comprising:

a MOS transistor switch for selectively transmitting an input voltage according to its gate voltage;

a hold capacitor electrically connected to the MOS transistor switch and generating an output voltage; and a constant voltage circuit supplying constant potential to a bulk terminal of the MOS transistor having a memory and a digital-to-analog converter that receives a digital signal from the memory.

2. The track and hold circuit according to claim 1, wherein the memory stores a numerical value and outputs the numerical value as the digital signal received by the digital-to-analog converter.

3. The track and hold circuit according to claim 1, wherein the memory stores a numerical value such that the signal received by the digital-to-analog converter minimizes a distortion of the track and hold circuit.

4. The track and hold circuit according to claim 3, wherein the distortion is in a group consisting of distortions due to a variation in a charging time of the hold capacitor in a track mode, and distortions due to an electric charge injection at the time of a mode transition.

* * * * *